United States Patent
Park

(10) Patent No.: US 7,087,524 B2
(45) Date of Patent: Aug. 8, 2006

(54) METHOD OF FORMING COPPER WIRING IN SEMICONDUCTOR DEVICE

(75) Inventor: Sang Kyun Park, Yongin-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 25 days.

(21) Appl. No.: 10/720,849

(22) Filed: Nov. 24, 2003

(65) Prior Publication Data

US 2005/0009331 A1 Jan. 13, 2005

(30) Foreign Application Priority Data

Jul. 9, 2003 (KR) ................. 10-2003-0046295

(51) Int. Cl.
*H01L 21/44* (2006.01)

(52) U.S. Cl. .................. 438/672; 438/660; 438/687

(58) Field of Classification Search ............... 438/621, 438/623, 624, 637, 652, 653, 660, 672, 680, 438/687

See application file for complete search history.

(56) References Cited

U.S. PATENT DOCUMENTS 6,753,610 B1 * 6/2004 Fukiage ............... 257/762
6,815,331 B1 * 11/2004 Lee et al. ............. 438/622
2002/0076925 A1   6/2002 Marieb et al.

OTHER PUBLICATIONS

Office Action issued by Korean Intellectual Property Office dated Jul. 11, 2005 (2 pages).

* cited by examiner

*Primary Examiner*—Phuc T. Dang
(74) *Attorney, Agent, or Firm*—Marshall, Gerstein & Borun LLP

(57) ABSTRACT

The present invention relates to a method of forming a copper wiring in a semiconductor device. A copper wiring is formed within a damascene pattern. Before a copper anti-diffusion insulating film is formed on the entire structure, a specific metal element is doped into the surface of the copper wiring and the surface of its surrounding insulating film to form a metal element-doping layer. The doped specific metal element reacts with surrounding other elements, due to heat upon depositing the copper anti-diffusion insulating film and a low dielectric constant interlayer insulating film and additional annealing process. For this reason, a copper alloy layer and a metal oxide layer are stacked at the interface of the copper wiring and the copper anti-diffusion insulating film and the metal oxide layer is formed at the interface of the insulating film and the copper anti-diffusion insulating film. The interfacial bondability between the copper anti-diffusion insulating film and each of the copper wiring and the insulating film underlying the insulating film is increased to improve reliability of the wiring.

9 Claims, 2 Drawing Sheets

METHOD OF FORMING COPPER WIRING IN SEMICONDUCTOR DEVICE

BACKGROUND

1. Field of the Invention

The present invention relates to a method of forming a copper wiring in a semiconductor device and, more specifically, to a method of forming a copper wiring in a semiconductor device capable of improving reliability of the wiring by increasing an interfacial bondability of a copper anti-diffusion insulating film with each of a copper wiring and an insulating film underlying the insulating film.

2. Discussion of Related Art

Generally, as the semiconductor industry shifts to an ultra large-scale integration (ULSI) level, the geometry of the device continues to be narrowed to a sub-half-micron region. In view of improved performance and reliability, the circuit density is gradually increased. Copper has a high resistance to electro-migration (EM) since it has a higher melting point than aluminum. Thus copper can improve reliability of the device. Further, copper can increase a signal transfer speed since it has a low resistivity. For this reason, in forming a metal wiring in a semiconductor device, copper has been used as an interconnection material useful for an integration circuit.

A method of burying copper that may be used currently includes a physical vapor deposition (PVD) method/reflow method, a chemical vapor deposition (CVD) method, an electroplating method, an electroless-plating method and the like. Preferred methods of them are the electroplating method and the CVD method, which have a relatively good copper burial characteristic.

While copper is used as the material of the metal wiring, a damascene scheme for simultaneously forming a via contact hole for electrical connection to a lower layer and a trench in which the metal wiring is located, has been widely used along with the process of forming the copper wiring in the semiconductor device. A low-dielectric insulating material having a low dielectric constant is used as the interlayer insulating film in which the damascene pattern will be formed.

In order to form the copper wiring in the damascene pattern having the via contact hole and the trench, copper is buried into the damascene pattern through several methods and the buried copper layer is then polished by a CMP process, thus making the buried copper layer isolated from neighboring copper wirings.

FIG. 1 is a sectional view for explaining the method of forming the copper wiring in the semiconductor device according to a prior art.

A first interlayer insulating film 12 and an anti-polishing layer 13 are formed on a substrate 11. The anti-polishing layer 13 and the first interlayer insulating film 12 are etched by a damascene scheme to form a damascene pattern 14.

A copper anti-diffusion conductive film 15 is formed along the surface of the anti-polishing layer 13 including the damascene pattern 14. A copper layer is then formed enough to sufficiently bury the damascene pattern 14. Next, the CMP process is performed until the anti-polishing layer 13 is exposed, thus forming a copper wiring 16 within the damascene pattern 14. Thereafter, a copper anti-diffusion insulating film 17 and a second interlayer insulating film 18 are formed on the entire structure including the copper wiring 16.

In the above-mentioned method, in order to prevent diffusion of copper elements from the copper wiring 16 to the outside, the copper wiring 16 is sealed using the copper anti-diffusion conductive film 15 and the copper anti-diffusion insulating film 17. In the device having the copper wiring 16 formed by the conventional method, however, most defective wiring generated by electro-migration and stress migration occurs at the interface between the copper anti-diffusion insulating film 17 and the copper anti-diffusion conductive film 15, as indicated by an arrow "A". This condition is caused by a lack in the interfacial bondability of the copper anti-diffusion insulating film 17 and the lower layers 13, 15 and 16.

SUMMARY OF THE INVENTION

The present invention is directed to a method of forming a copper wiring in a semiconductor device capable of improving electrical characteristics and reliability of the device, by increasing an interfacial bondability of a copper anti-diffusion insulating film and its lower layers to prevent migration of copper elements in a copper wiring.

According to a preferred embodiment of the present invention, there is provided a method of forming a copper wiring in a semiconductor device, comprising the steps of: forming a first interlayer insulating film and an anti-polishing layer on a substrate; etching the anti-polishing layer and the first interlayer insulating film to form a damascene pattern; forming a copper anti-diffusion conductive film and a copper layer on the anti-polishing layer including the damascene pattern; forming a copper wiring within the damascene pattern; forming a metal element doping layer on the surface of the entire structure including the copper wiring; and forming a copper anti-diffusion insulating film and a second interlayer insulating film on the entire structure on which the metal element doping layer is formed, wherein a copper alloy layer and a metal oxide layer are formed at the interface of the copper wiring and the copper anti-diffusion insulating film due to heat upon depositing the insulating film, and the metal oxide layer is formed at the interface of layers around the copper wiring and the copper anti-diffusion insulating film. At this time, the metal oxide layer may be formed with a uniform thin film, or an unevenness layer having an island shape.

In the aforementioned of a method of forming a copper wiring in a semiconductor device according to another embodiment of the present invention, the metal element doping layer is formed by doping a specific metal element by means of an implantation method or a plasma doping method and is formed by controlling a depth and a concentration of the doping so that a thickness of the copper alloy layer becomes 10 to 500 Å. The specific metal element is a metal element such as Mg, Cd, Be, Sn and Pd.

DETAILED DESCRIPTION OF PREFERRED EMBODIMENTS

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Figure 1:
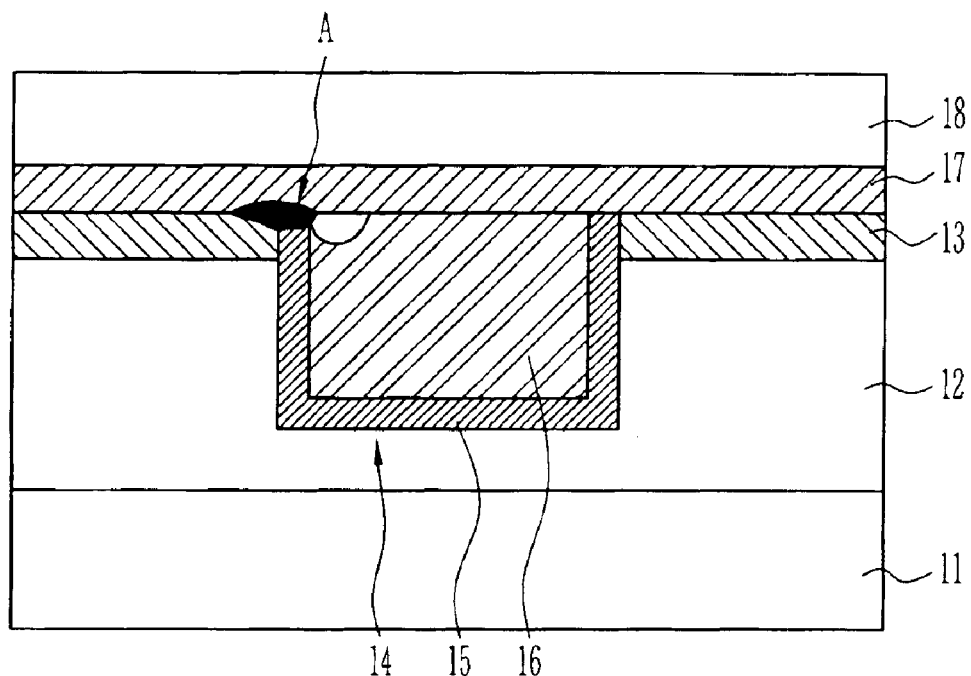
FIG. 1 is a sectional view for explaining a method of forming a copper wiring in a semiconductor device according to a prior art.
Figure 2A:
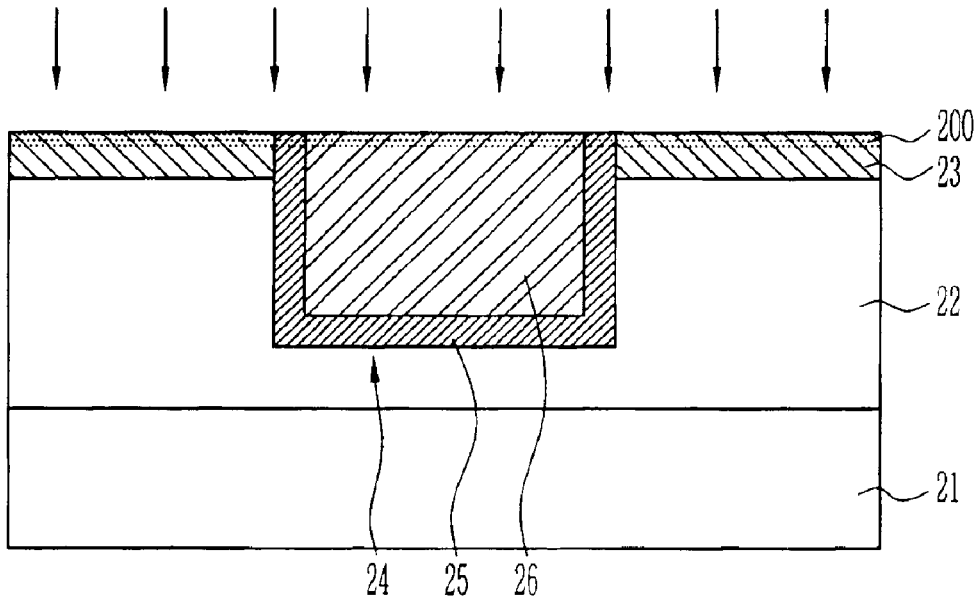
FIGS. 2A to 2C are sectional views for explaining a method of forming a copper wiring in a semiconductor device according to an embodiment of the present invention.
Figure 2B:
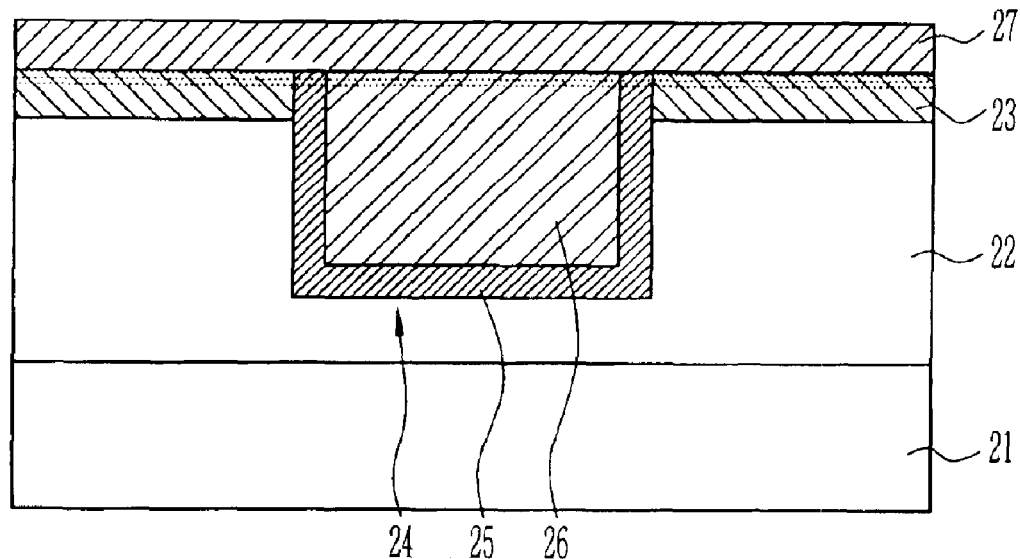
Figure 2C:
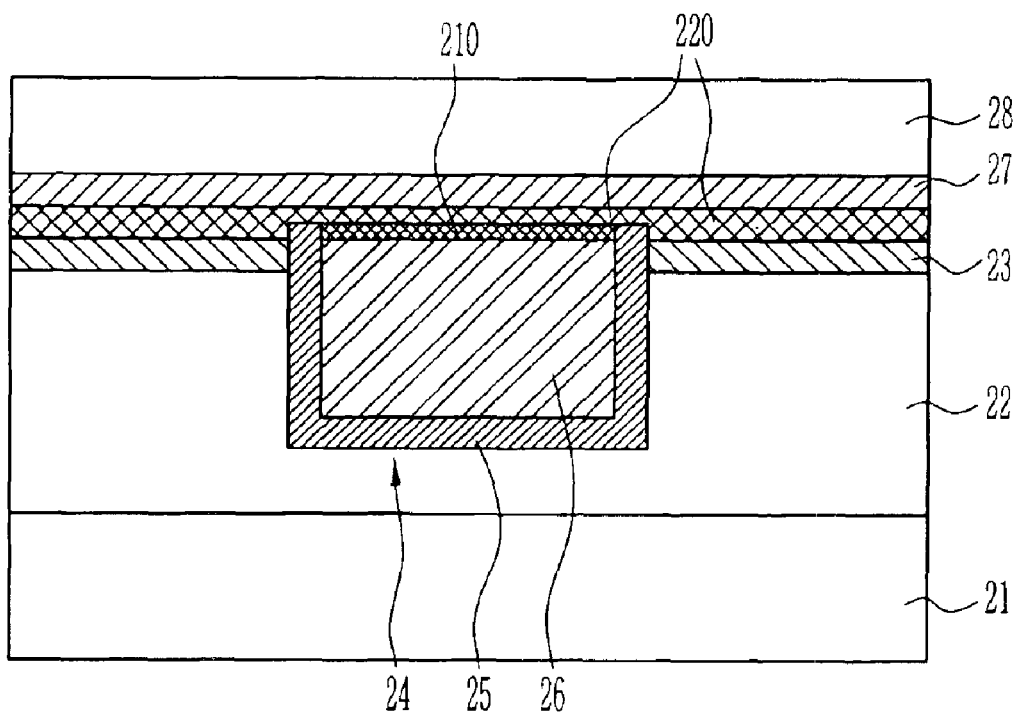

FIGS. 2A to 2C are sectional views for explaining a method of forming a copper wiring in a semiconductor device according to an embodiment of the present invention.

Referring to FIG. 2A, a first interlayer insulating film 22 and an anti-polishing layer 23 are formed on a substrate 21. The anti-polishing layer 23 and the first interlayer insulating film 22 are etched by a damascene scheme to form a damascene pattern 24. A copper anti-diffusion conductive film 25 is then formed along the surface of the anti-polishing layer 23 including the damascene pattern 24. A copper layer is then formed enough to sufficiently bury the damascene pattern 24. Next, a chemical mechanical polishing (CMP) process is performed until the anti-polishing layer 23 is exposed, thereby forming a copper wiring 26 within the damascene pattern 24. A specific metal element is doped into the surface of the first interlayer insulating film 22 including the copper wiring 26, thus forming a metal element-doping layer 200.

In the above, the first interlayer insulating film 22 is formed using a low dielectric constant in order to solve problems due to parasitic capacitance between the wirings. For example, the first interlayer insulating film 22 is formed using materials wherein H, F, C, $CH_3$, etc. are partially combined in $SiO_2$ series having a dielectric constant of 1.5 to 4.5, organic materials such as SiLK™ product, Flare™ product having C—H as a basic structure, and porous materials whose porosity is increased in order to lower the dielectric constant of the above materials.

The anti-polishing layer 23 may be formed using oxide not containing carbon, or may be formed using silicon nitride and silicon oxynitride containing nitrogen or silicon carbide series containing carbon by means of the chemical vapor deposition (CVD) method so that they can have a copper anti-diffusion characteristic.

The copper anti-diffusion conductive film 25 may be formed by one of ionized PVD TiN, CVD TiN, MOCVD TiN, ionized PVD Ta, ionized PVD TaN, CVD Ta, CVD TaN and CVD WN.

The metal element-doping layer 200 is formed by doping the specific metal element having a given concentration in a given depth by means of the implantation method or the plasma doping method. The specific metal element is a metal element such as Mg, Cd, Be, Sn and Pd, having characteristics that it is melted in copper in a given concentration at a given temperature to form an alloy, educed in a grain boundary to prohibit migration of the copper elements, and react with a very small amount of oxygen to form a metal oxide of a fine film quality. The metal element-doping layer 200 is formed under the condition that the interfacial bondability can be maximized while minimizing increase in resistivity of the copper wiring due to the specific metal elements. At this time, the metal element doping layer 200 is formed by controlling the depth and concentration of the doping so that the thickness of a copper alloy layer that will be formed later is below 500 Å, preferably 10 to 500 Å, more preferably 100 to 400 Å. At this time, the concentration of the specific metal element doped does not exceed 10%, preferably 0.5 to 10%, more preferably 3 to 8%.

Referring to FIG. 2B, a copper anti-diffusion insulating film 27 is formed on the entire structure on which the metal element-doping layer 200 is formed.

In the above, the copper anti-diffusion insulating film 27 is formed over 300 Å in a single layer or multiple layers using one of silicon nitride (SiNx), silicon carbide (SiCx) and silicon nitrocarbide (SiCN), all of which contain a very small amount of oxygen.

Meanwhile, before the copper anti-diffusion insulating film 27 is formed, a plasma treatment is performed in order to remove a copper oxide layer (not shown) generated on the surface of the copper wiring 26 while stabilizing the copper wiring 26. In the above, the plasma treatment may be carried out before the metal element doping layer 200 is formed, immediately before the copper anti-diffusion insulating film 27 is formed after the metal element doping layer 200 is formed, or before and after the metal element doping layer 200 is formed. The plasma treatment may be performed in-situ while doping the specific metal element in order to form the metal element-doping layer 200. Such plasma treatment is performed using a mixed gas of nitrogen and hydrogen or an ammonia series gas at a temperature in the range of 100 to 350° C.

By reference to FIG. 2C, a second interlayer insulating film 28 is formed on the entire structure including the copper anti-diffusion insulating film 27. An annealing process is then performed so that the specific metal element of the metal element-doping layer 200 can react with surrounding other elements. Accordingly, a copper alloy layer 210 and a metal oxide layer 220 are stacked at the interface of the copper wiring 26 and the copper anti-diffusion insulating film 27. The metal oxide layer 220 is formed at the interface of the anti-polishing layer 23 and the copper anti-diffusion insulating film 27. Furthermore, the metal oxide layer 220 is formed at the interface of the copper anti-diffusion conductive film 25 and the copper anti-diffusion insulating film 27.

In the above, it is preferred that the second interlayer insulating film 28 is formed using a material of a low dielectric constant if it is a multi-layer wiring structure, in order to solve problems due to parasitic capacitance between the wirings as in the first interlayer insulating film 22. If it is a single layer metal wiring structure, however, the second interlayer insulating film 28 may be usually formed using other insulating materials that are used as the interlayer insulating film of the semiconductor device.

The annealing process is performed over 1 minutes, preferably 10 to 30 minutes at a temperature range of 100 to 500° C. Meanwhile, the annealing processes for forming the copper alloy layer 210 and the metal oxide layer 220 are not separately performed, but heat in the process of depositing each of the copper anti-diffusion insulating film 27 and the low dielectric constant interlayer insulating film 28 may be used.

The copper alloy layer 210 is formed as the specific metal element of the metal element doping layer 200 are melted in copper elements of the copper wiring 26 during the annealing process. The metal oxide layer 220 that is formed on the copper wiring 26, on the layers 23 and 25 around the copper wiring 26 is formed to have a fine film quality since a very small amount of oxygen contained in the copper anti-diffusion insulating film 27 and the specific metal element of the metal element doping layer 200 are combined.

As described above, according to the present invention, a copper alloy layer and a metal oxide layer are stacked at the interface of a copper wiring and a copper anti-diffusion insulating film. The metal oxide layer is formed at the interface of layers around the copper wiring and a copper anti-diffusion insulating film. Thus the interfacial bondability of the copper anti-diffusion insulating film is increased.

It is therefore possible to improve electrical characteristics and the yield due to improved reliability of the wiring.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of forming a copper wiring in a semiconductor device, comprising the steps of:
    forming a first interlayer insulating film and an anti-polishing layer on a substrate;
    etching the anti-polishing layer and the first interlayer insulating film to form a damascene pattern;
    forming a copper anti-diffusion conductive film and a copper layer on the anti-polishing layer including the damascene pattern;
    forming a copper wiring within the damascene pattern;
    forming a metal element doping layer on the surface of the entire structure including the copper wiring; and
    forming a copper anti-diffusion insulating film and a second interlayer insulating film on the entire structure on which the metal element doping layer is formed, wherein a copper alloy layer and a metal oxide layer are formed at the interface of the copper wiring and the copper anti-diffusion insulating film due to heat upon depositing the insulating film, and the metal oxide layer is formed at the interface of layers around the copper wiring and the copper anti-diffusion insulating film.

2. The method of claim 1, wherein the metal element doping layer is formed by doping a specific metal element by means of an implantation method or a plasma doping method, and the copper alloy layer is formed to have a thickness in the range of 10 Å to 500 Å, by controlling a depth and a concentration.

3. The method of claim 2, wherein the metal element doping layer is formed so that the concentration of the specific metal element is in the range of 0.5% to 10%.

4. The method of claim 2, wherein the specific metal element is a metal element such as Mg, Cd, Be, Sn and Pd.

5. The method of claim 1, wherein the metal element doping layer is formed so that a concentration of a specific metal element is in the range of 0.5% to 10%.

6. The method of claim 1, wherein in order to remove a copper oxide layer generated on the surface of the copper wiring, a plasma treatment is performed in one of a process before the metal element doping layer is formed, a process in which the metal element doping layer is formed and a process after the metal element doping layer is formed.

7. The method of claim 6, wherein the plasma treatment is performed using a mixed gas of nitrogen and hydrogen or an ammonia series gas at a temperature in the range of 100° C. to 350° C.

8. The method of claim 1, wherein after the second interlayer insulating film is formed, an annealing process for forming the copper alloy layer and the metal oxide layer is performed.

9. The method of claim 8, wherein the annealing process is performed at a temperature in the range of 100° C. to 500° C.

* * * * *